(12) United States Patent
Sandhu (10) Patent No.: US 8,427,245 B2
(45) Date of Patent: Apr. 23, 2013

(54) ULTRA LOW POWER OSCILLATOR

(75) Inventor: Bal S Sandhu, Fremont, CA (US)

(73) Assignee: ARM Limited, Cambridge (GB)

( * ) Notice: Subject to any disclaimer, the term of this patent is extended or adjusted under 35 U.S.C. 154(b) by 146 days.

(21) Appl. No.: 13/067,471

(22) Filed: Jun. 2, 2011

(65) Prior Publication Data

US 2011/0298550 A1 Dec. 8, 2011

Related U.S. Application Data

(60) Provisional application No. 61/351,639, filed on Jun. 4, 2010.

(51) Int. Cl.
*H03B 5/24* (2006.01)

(52) U.S. Cl.
USPC .......................................... 331/57; 331/108 C (58) Field of Classification Search .................... 331/57, 331/108 C
See application file for complete search history.

(56) References Cited

U.S. PATENT DOCUMENTS

| | | | | |
|---|---|---|---|---|
| 5,563,553 | A * | 10/1996 | Jackson | 331/57 |
| 5,629,650 | A * | 5/1997 | Gersbach et al. | 331/17 |
| 7,973,612 | B2 * | 7/2011 | Raghunathan et al. | 331/186 |
| 2010/0231312 | A1 * | 9/2010 | Denier | 331/111 |

OTHER PUBLICATIONS

M.G. Johnson et al, "A Variable Delay Line PLL for CPU—Coprocessor Synchronization" *IEEE Journal of Solid-State Circuits*, vol. 23, No. 5, Oct. 1988, pp. 1218-1223.

D. Sheng et al, "An Ultra-Low-Power and Portable Digitally Controlled Oscillator for SoC Applications" *IEEE Transactions on Circuits and Systems*, vol. 54, No. 11, Nov. 2007, pp. 954-958.

S. Joeres et al, "Design of a Ring-Oscillator with a Wide Turning Range in 0.13 μm CMOS for use in Global Navigation Satellite Systems" Institute for Semiconductor Electronics, RWTH Aachen University, pp. 529-535.

M. Savic et al, "Frequency Synthesizer Design in CMOS" *Proc. 51$^{st}$ ETRAN Conference*, Jun. 2007, 4 pages.

G.S. Jovanovic et al, "Linear Current Starved Delay Element" Faculty of Electronic Engineering, 4 pages.

* cited by examiner

*Primary Examiner* — Joseph Chang
(74) *Attorney, Agent, or Firm* — Nixon & Vanderhye P.C.

(57) ABSTRACT

A frequency generator is provided which is embodied in an integrated circuit manufactured at a process node below 100 nm. The frequency generator comprises a current starved oscillator configured to generate an output frequency signal in dependence on a voltage of a bias signal and a self-biased current generator configured to generate the bias signal, wherein the self-biased current generator comprises a first transistor and a second transistor connected in series. The bias signal is taken from a midpoint between the first transistor and the second transistor, and respective gates of the first and second transistors are connected to keep said first and second transistors in a cut-off state. Accordingly the self-biased current generator operates in a deep sub-threshold state and a current of said bias signal is dependent on a leakage current in the first and second transistors.

25 Claims, 8 Drawing Sheets

ULTRA LOW POWER OSCILLATOR

This application claims priority to U.S. Provisional Application No. 61/351,639, filed Jun. 4, 2010, the entire content of which is hereby incorporated by reference.

BACKGROUND OF THE INVENTION

1. Field of the Invention

The present invention relates to data processing apparatuses configured to generate an output frequency signal. More particularly, this invention relates to such oscillators that are configured to consume very little power.

2. Description of the Prior Art

It is known in the field of data processing apparatuses to provide an oscillator to generate an output frequency signal having a characteristic frequency. For example, one typical implementation is a sequence of an odd number of inverters having a feedback path from the output of the last inverter to the input of the first inverter. In such a ring oscillator, it is known that the output frequency $F_{OSC}$ is given by $F_{OSC}=i/(C.\Delta V.N)$, where N is the number of inverter stages, $\Delta V$ is the voltage swing, C is the load and i is the driving current drawn by the ring oscillator. Accordingly, the output frequency of the signal generated by the ring oscillator can be controlled by the provision of an appropriate drive current.

A problem arises however in the implementation of such devices as the process technologies for integrated circuit manufacture become ever smaller. This is because at "sub-nanometer" process technologies (process nodes below 100 nm), the gain and leakage of the MOS devices is so high that a traditional ring oscillator with inverter stages becomes impractical. For example, a 15 stage ring oscillator produced at the nm process node runs at 11 GHz and burns several mille-Amps (mA) of current. Not only is this output frequency impractically high for typical implementation purposes, but further the current drawn is also undesirably high, in particular in the context of integrated circuits provided within low power (e.g. portable) devices.

Previously provided oscillator designs are described in: "Frequency Synthesizer Design In CMOS", Milan Savić, Miljan Nikolić, Dragiša Milovanović, FProc. 51st ETRAN Conference, Herceg Novi—Igalo, Jun. 4-8, 2007; "Design of a Ring-Oscillator with a Wide Tuning Range in 0.13 μm CMOS for the use in Global Navigation Satellite Systems", S. Joeres, A. Kruth, O. Meike, G. Ordu, S. Sappok, R. Wunderlich and S. Heinen, Institute for Semiconductor Electronics, RWTH Aachen University, Germany; "A variable delay line PLL for CPU-coprocessor synchronization", Johnson, M. G. and Hudson, E. L., IEEE Journal of Solid-State Circuits, October 1988, Vol. 23, No. 5, pp. 1218-1223; "An Ultra-Low-Power and Portable Digitally Controlled Oscillator for SoC Applications", Duo Sheng; Ching-Che Chung; Chen-Yi Lee, IEEE Transactions on Circuits and Systems II: Express Briefs, November 2007, Vol. 54, No. 11, pp. 954-958; and "Linear Current Starved Delay Element", Goran S. Jovanović and Mile K. Stojčev, Faculty of Electronic Engineering, Beogradska 14, 18000 Niš, Serbia and Montenegro.

It would be desirable to provide an improved technique for the generation of an output frequency signal, in particular which would allow the generation of frequencies in a useful range, with modest power consumption, in an integrated circuit manufactured at contemporary (sub-nanometer) process nodes.

SUMMARY OF THE INVENTION

Viewed from a first aspect, the present invention provides a frequency generator embodied in an integrated circuit manufactured at a process node below 100 nm, the frequency generator comprising: a current starved oscillator configured to generate an output frequency signal in dependence on a voltage of a bias signal; and a self-biased current generator configured to generate said bias signal, wherein said self-biased current generator comprises a first transistor and a second transistor connected in series, said bias signal being taken from a midpoint between said first transistor and said second transistor, and respective gates of said first and second transistors are connected to keep said first and second transistors in a cut-off state, such that said self-biased current generator operates in a deep sub-threshold state and a current of said bias signal is dependent on a leakage current in said first and second transistors.

A current starved oscillator is provided as the frequency generation element and is provided with a bias signal, the voltage of which dictates the current drawn by the current starved oscillator and hence the frequency of its output frequency signal. The inventor of the present invention realised that as manufacturing technologies reach ever smaller process nodes, the increasing leakage of the MOS devices, usually perceived as an inevitable problem which must be coped with, could in fact be turned to the advantage of the system designer in the context of the provision of a low power frequency generator. Accordingly, in order to generate a bias signal for the current starved oscillator of sufficiently low current, a self-biased current generator is provided which is capable of producing an ultra-low current bias signal.

The self-biased current generator comprises a first transistor and a second transistor connected in series, wherein the bias signal is taken from a midpoint between the two. In particular, the respective gates of the two transistors are connected to keep each transistor in a cut-off state. For example, by coupling together the source and gate of each transistor, the transistor is held in what would usually be perceived as a fully "off" state. However, the inventor of the present invention recognised that due to the increasing gain and leakage of MOS devices in sub-nanometer process technologies, which prevents such transistors from fully switching off, a small leakage current will continually flow which could be exploited in the context of a current starved oscillator. In particular, the self-biased current generator of the present technique takes advantage of this fact by generating the bias signal for the current starved oscillator at the midpoint between the two switched-off transistors. Accordingly, this self-biased current generator operates in a deep sub-threshold state (i.e. substantially below $V_T$) and the current of the bias signal generated is dependent upon the leakage current in the first and second transistors. Hence, the leakage of the MOS devices, which increases at smaller and smaller process nodes, is in fact taken advantage of in order to generate the ultra-low current required to cause the current starved oscillator to operate at a useful output frequency.

Depending on the particular process node at which the integrated circuit is manufactured, the leakage current in the first and second transistors, which determines the current of the bias signal for the current starved oscillator, may be at a level which would cause the current starved oscillator to generate an output frequency signal which has a frequency lower than that required for the purposes of the system. Hence, in one embodiment the frequency generator comprises a current multiplier, said current multiplier configured to receive said bias signal from said self-biased current generator, to multiply up said current of said bias signal to generate an enhanced current bias signal, and to provide said enhanced current bias signal to said current starved oscillator. Accordingly, an enhanced current bias signal can be produced having a current which is greater than that of the original bias signal generated by the self-biased current generator, and can therefore be used to drive the current starved oscillator at an appropriately higher frequency.

The current starved oscillator may be arranged to generate its output frequency signal in dependence a bias signal provided in two parts, namely at respective positive and negative bias inputs of the oscillator. In such embodiments, said current multiplier may be further configured to generate a mirrored enhanced current bias signal, and to provide said enhanced current bias signal and said mirrored enhanced current bias signal to respective positive and negative bias inputs of said current starved oscillator.

Whilst in some embodiments it may be appropriate for the frequency generator to be configured to generate the output frequency signal only in dependence on the leakage current in the first and second transistors, it may be desirable to configure the frequency generator to be switched to operate in a different frequency range. Accordingly, in one embodiment the frequency generator further comprises a further self-biased current generator configured to generate a further bias signal; and a multiplexer configured to receive said bias signal from said self-biased current generator and said further bias signal from said further self-biased current generator, and said multiplexer is further configured to output a selected bias signal to said current starved oscillator in dependence on a selection signal. This arrangement enables the configuration of the frequency generator to be controlled in dependence on the selection signal, by selecting the bias signal applied to the current starved oscillator from between two alternative self-biased current generators. Furthermore, this arrangement enables the switching between the two frequency regimes of the frequency generator to be performed very smoothly, with very little noise.

Indeed, the configuration may not be limited to a selection between only two modes of operation and in some embodiments the frequency generator further comprises at least one additional further self-biased current generator configured to generate at least one additional further bias signal. Accordingly, the selection signal can control a multiplexer to select the bias signal to apply to the current starved oscillator from between a number of self-biased current generators, and accordingly select one of a number of frequency regimes in which the current starved oscillator can operate.

There are a number of ways in which such a further self-biased current generator could be configured, but in one embodiment said further self-biased current generator comprises: two further transistors connected in series, said further bias signal being generated at a further midpoint between said further transistors, and respective gates of said further transistors are connected to operate said further self-biased current generator in a strong inversion state, such that a current of said further bias signal is greater than said current of said bias signal, and such that a frequency of said output frequency signal is greater in response to said further bias signal than in response to said bias signal. Accordingly, by contrast to the first self-biased current generator which operates in a deep sub-threshold state, the further self-biased current generator is configured to operate in a strong inversion state, thus providing the further bias signal with a greater current than that of the bias signal. This correspondingly means that the frequency of the output frequency signal generated by the current starved oscillator is correspondingly greater and a second, higher frequency regime of the frequency generator is provided. Configuring the further self-biased current generator to operate in a strong inversion state may for example be provided by arranging the further transistors such that they are gate-drain coupled.

It may be the case that in the further self-biased current generator the further transistors may need to be stronger than the maximum size of transistor which can be provided at the process node, and accordingly in one embodiment at least one of said two further transistors of said further self-biased current mirror comprises a transistor pair configured to provide a longer channel length transistor. Hence, in situations where a maximum channel length transistor at the process node does not provide the required performance, at least one of the two further transistors can be provided as a transistor pair, effectively doubling the channel length of that transistor.

The particular configuration of the current starved oscillator may vary from implementation to implementation, but in one embodiment said current starved oscillator comprises a plurality of inverters, wherein each inverter of said plurality of inverters is connected to voltage supply rails via bias transistors controlled in dependence on said bias signal. By connecting the inverters of the current starved oscillator to the voltage supply rails (e.g. to VDD and VSS respectively) via bias transistors which are controlled in dependence on the bias signal, the current which may be drawn by each inverter from the voltage supply rails is limited, in dependence on the degree to which the bias signal turns on the bias transistors.

In one such embodiment, said bias transistors comprise a supply-side bias transistor and a ground-side bias transistor, wherein said supply-side bias transistor is controlled in dependence on said bias signal and said ground-side bias transistor is controlled by a mirrored version of said bias signal. Accordingly, a supply-side bias transistor controls the connection of the inverters to the supply-side voltage rail (e.g. to VDD) and the ground-side bias transistor controls the connection of the inverters to a ground-side voltage supply rail (e.g. to VSS). By providing a mirrored version of the bias signal, a symmetric control arrangement for the respective biased transistors in the current starved oscillator is provided, and the swing of the oscillator is correspondingly symmetric. Furthermore, mirroring the bias signal from the supply-side to the ground-side in this manner avoids transient currents in the system.

The fact that the current of the bias signal generated by the self-biased current generator is dependent on the leakage current in the first and second transistors means that the frequency of the output frequency signal generated by the current starved oscillator can be used as a quantitative measure of the leakage current flowing in the first and second transistors. Due to this, in one embodiment said first transistor and said second transistor have a minimum oxide thickness and a minimum channel length for the process node. This then means that the frequency of the output frequency signal generated can be used to monitor the base-line leakage current in the smallest channel length transistors of the integrated circuit (i.e. those that have a minimum oxide thickness and a minimum channel length for the process node).

As part of the effort to produce integrated circuits at ever smaller geometries, it is common that the majority of transistors in an integrated circuit are provided with a minimum size possible for the process node. Accordingly, the majority of transistors in the integrated circuit will typically be sized according to this minimum size and it is advantageous when using the frequency generator to monitor the leakage current if the monitored leakage current represents the majority of transistors in the integrated circuit. Accordingly, in one embodiment said first transistor and second transistor have an oxide thickness and a channel length which are sized like a majority of transistors in said integrated circuit.

For example, whilst a frequency generator may be provided as part of an input-output region of an integrated circuit, a greater number of transistors may typically be provided in a core region of the integrated circuit, and in one embodiment said frequency generator forms part of an input-output region of said integrated circuit and said integrated circuit further comprises a core region, wherein said first transistor and said second transistor have an oxide thickness and a channel length corresponding to core region transistors. Accordingly, the frequency of the out-put frequency signal generated by the frequency generator can provide an indication of the leakage current occurring in those core region transistors, by virtue of the fact that the first and second transistor are sized to match those core region transistors.

Conversely, when a further self-biased generator is provided it may be advantageous for the further transistors in the further self-biased current generator to differ as much as possible from the lower limit of the process node and in some embodiments said further transistors have an oxide thickness and a channel length which are maximum sized for the process node. Similarly, it may be advantageous for these further transistors to differ in size from the majority of transistors in the integrated circuit and in one embodiment said further transistors have an oxide thickness and a channel length which are sized to be larger than a majority of transistors in said integrated circuit.

Further, when the frequency generator forms part of an input-output region of the integrated circuit and the integrated circuit further comprises a core region, in one embodiment the further transistors may be sized according to the transistors provided in the input-output region. Thus, in one embodiment said frequency generator forms part of an input-output region of said integrated circuit and said integrated circuit further comprises a core region, wherein said further transistors have an oxide thickness and a channel length corresponding to input-output region transistors.

The particular process node which the integrated circuit is manufactured may vary, for example in some embodiments said process node is below 65 nm, whilst in other embodiments said process node is below 32 nm.

It is advantageous in the arrangement of the self-biased current generator if the first transistor and the second transistor are well matched and accordingly in one embodiment said first transistor and said second transistor are a same type of transistor. In particular, in one embodiment said first transistor and said second transistor are PMOS transistors. PMOS transistors may be preferable due to the large capacitance of VDD, meaning that the use of PMOS transistors will produce less noise in the system. In one embodiment, in order to ensure that the transistors are kept in their cut-off state the transistors are source-gate coupled.

Given that the frequency of the output frequency signal is dependent on the current of the bias signal provided to the current starved oscillator, and that the current of the bias signal generated by the self-biased current generator depends on the leakage current in its transistors, it is advantageous to make use of the output frequency signal to provide an indication of the leakage current in the transistors. Accordingly, in one embodiment the frequency generator further comprises a digital counter configured to receive said output frequency signal and to increment in dependence on transitions of said output frequency signal; and a power management unit configured read said digital counter before and after a predetermined time period to determine a count value. The count value thus forms a quantitative measure of the leakage current, which can then be used appropriately in further components of the system.

For example, in one embodiment said power management unit is configured to perform system control operations in dependence on said count value. For example, the power management unit may be configured to take appropriate action if the leakage current is deemed to be too high, for example reducing the operating voltage of the system, such that its overall power consumption is not allowed to rise too high.

Viewed from a second aspect the present invention provides a frequency generator embodied in an integrated circuit manufactured at a process node below 100 nm, the frequency generator comprising: current starved oscillator means for generating an output frequency signal in dependence on a voltage of a bias signal; and self-biased current generator means for generating said bias signal, wherein said self-biased current generator means comprises a first transistor and a second transistor connected in series, said bias signal being taken from a midpoint between said first transistor and said second transistor, and respective gates of said first and second transistors are connected to keep said first and second transistors in a cut-off state, such that said self-biased current generator means operates in a deep sub-threshold state and a current of said bias signal is dependent on a leakage current in said first and second transistors.

Viewed from a third aspect the present invention provides a method of generating an output frequency signal in a frequency generator embodied in an integrated circuit manufactured at a process node below 100 nm, the method comprising the steps of: providing a self-biased current generator arranged to generate a bias signal, wherein said self-biased current generator comprises a first transistor and a second transistor connected in series, said bias signal being taken from a midpoint between said first transistor and said second transistor, and respective gates of said first and second transistors are connected to keep said first and second transistors in a cut-off state; operating said self-biased current generator in a deep sub-threshold state to generate said bias signal, such that a current of said bias signal is dependent on a leakage current in said first and second transistors; and generating an output frequency signal in dependence on a voltage of said bias signal in a current starved oscillator.

Viewed from a fourth aspect the present invention provides a data processing system embodied in an integrated circuit manufactured at a process node below 100 nm, the data processing system comprising a frequency generator according to the first aspect and further comprising: a further self-biased current generator configured to generate a further bias signal; and a multiplexer configured to receive said bias signal from said self-biased current generator and said further bias signal from said further self-biased current generator, and said multiplexer is further configured to output a selected bias signal to said current starved oscillator in dependence on a selection signal, wherein said data processing system comprises a power management unit configured to generate said selection signal in dependence on an operating state of said data processing system.

BRIEF DESCRIPTION OF THE DRAWINGS

The present invention will be described further, by way of example only, with reference to embodiments thereof as illustrated in the accompanying drawings, in which.

DESCRIPTION OF THE PREFERRED EMBODIMENTS

Figure 1:
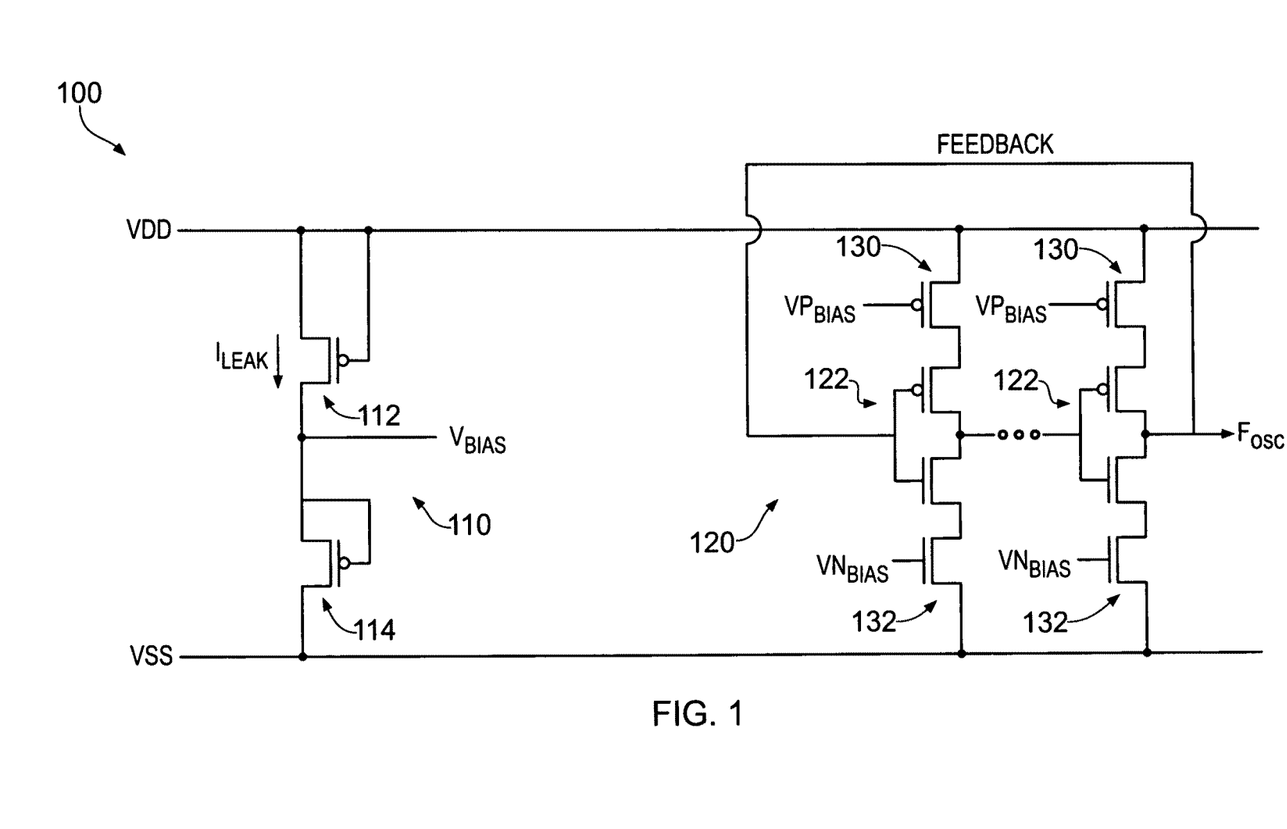
FIG. 1 schematically illustrates a frequency generator in one embodiment.

FIG. 1 schematically illustrates a frequency generator 100 in one embodiment. The frequency generator comprises a self-biased current generator 110 and a current starved oscillator 120. The self biased current generator 110 comprises two PMOS transistors 112, 114, which are source-gate coupled such that both transistors 112 and 114 are held in a cut-off state. Accordingly, the self-biased current generator operates in a deep sub-threshold state in which formally both transistors are fully off. However, the illustrated frequency generator 100 is embodied in an integrated circuit manufactured at a "sub-nanometer" process node. More specifically, the integrated circuit is manufactured at a CMOS 20 nm process. Accordingly, fully switching off the transistors on this process node is not possible, and even when held in their cut-off state, a leakage current $I_{LEAK}$ persists. The exact level of this leakage current will depend on the environmental conditions in which the integrated circuit is held, in particular on its temperature. The midpoint node between the first transistor 112 and second transistor 114 in the self-biased current generator 110 is used to provide a bias signal $V_{BIAS}$.

The current starved oscillator 120 comprises a series of inverters 122, concatenated together and having a feedback path which leads from the output of the last inverter back to the input of the first inverter. Note that only two inverters (the first and the last in the chain) are explicitly shown, with the intervening inverters omitted for clarity of illustration. The current starved oscillator generates an output frequency signal $F_{OSC}$. The "current starvation" of the oscillator is arranged by the provision of the supply-side bias transistors 130 and the ground-side bias transistors 132. Respective bias voltages VPBIAS and VNBIAS control these bias transistors, such that the current which may be drawn by the inverters 122 is limited, thus correspondingly limiting the frequency of oscillation of the oscillator 120. Although in principle the bias signal $V_{BIAS}$ could be provided directly to the bias transistors on one side of the current starved oscillator 120 (e.g. to the supply-side bias transistors 130), in a typical implementation it may be desirable to increase current of this bias signal before applying it to the current starved oscillator, as will be described in more detail in the following.

Figure 2:
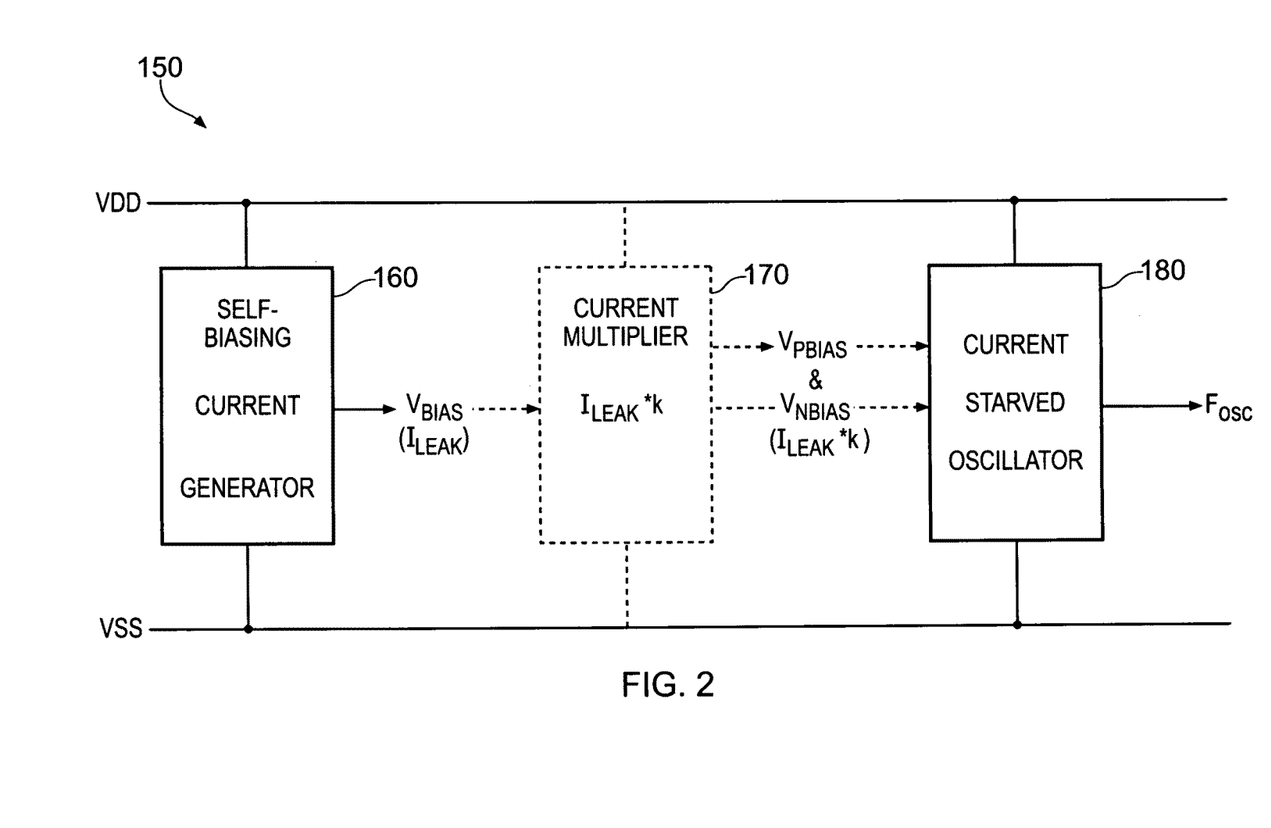
FIG. 2 schematically illustrates a frequency generator comprising a current multiplier in one embodiment.

FIG. 2 schematically illustrates the enhancement of the current of the bias signal in one embodiment. The illustrated frequency generator 150 comprises a self-biasing current generator 160 (which is configured like the self-biasing current generator 110 in FIG. 1), a current multiplier 170, and a current starved oscillator 180 (configured like the current starved oscillator 120 illustrated in FIG. 1). The current multiplier 170 is configured to receive the bias signal $V_{BIAS}$ from the self-biasing current generator 160 and to multiply up the current of the bias signal by a factor k to generate an enhanced current biased signal $V_{BIAS}$ having an enhanced current $I_{LEAK}*k$. This enhanced current biased signal is then provided to the current starved oscillator 180, typically in two parts as a positive bias signal $V_{PBIAS}$ and a negative bias signal $V_{NBIAS}$, which effectively operates as a current-to-frequency converter to generate the output frequency signal $F_{OSC}$.

Figure 3:
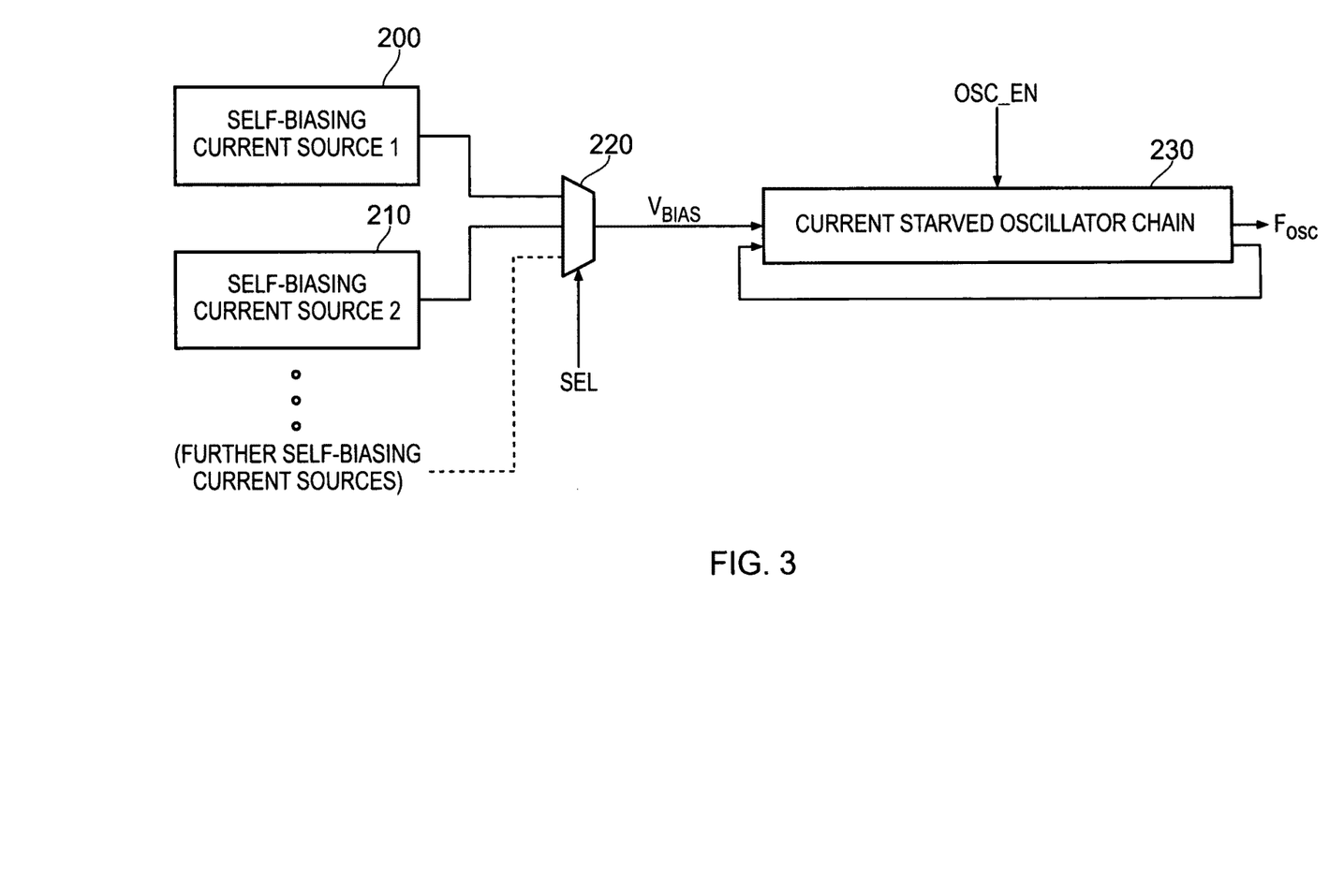
FIG. 3 schematically illustrates a frequency generator in one embodiment comprising more than one self-biasing current source and the selection of a bias signal for a current starved oscillator in dependence on a selection signal.

Depending on the system requirements, it may be advantageous to configure the frequency generator to be able to generate an output frequency signal in more than one frequency regime. Accordingly, in embodiments such as that illustrated in FIG. 3, more than one self-biasing current source can be provided. In FIG. 3, two self biasing current sources 200, 210 are shown, but as noted in the figure further self-biasing current sources could also be provided. The bias signals generated by each self-biasing current source provide the inputs to a multiplexer 220 which selects one of these inputs in dependence on its selection signal SEL. The selected bias signal $V_{BIAS}$ is then provided to a current starved oscillator 230 as described above with reference to FIG. 1. The current starved oscillator 230 can be enabled by the signal OSC_EN.

Figure 4:
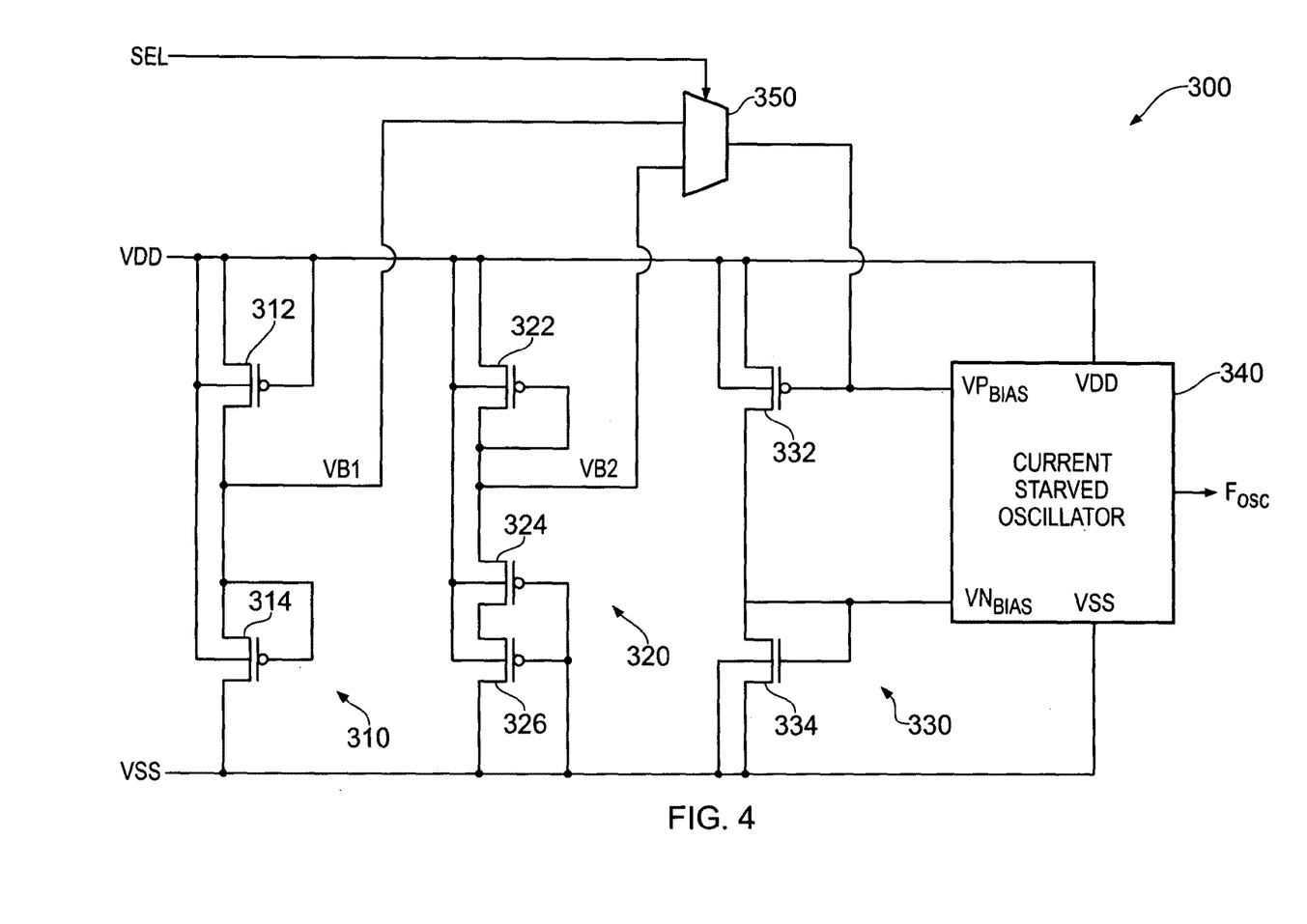
FIG. 4 schematically illustrates in more detail a frequency generator in one embodiment in which the bias signal for a current starved oscillator can be selected between bias signals provided by two self-biased current mirrors.

FIG. 4 schematically illustrates in more detail the configuration of a frequency generator 300, which is configured to be switched between a two frequency regimes in dependence on a selection signal SEL. Generally, the frequency generator 300 comprises a first self-biased current generator 310, a second self-biased current generator 320, a current multiplier 330, a current starved oscillator 340 and a multiplexer 350. It will be appreciated that the first self-biased current generator 310 and second self-biased current generator 320 act in this embodiment as first and second self-biased current mirrors respectively, via their connection to PMOS transistor 332.

The first self-biased current mirror 310 comprises a first PMOS transistor 312 and a second PMOS transistor 314. Each of the PMOS transistors 312, 314 have their wells tied to VDD to avoid latchup. The gates of each PMOS transistor 312, 314 are coupled to their respective sources, such that each transistor is kept in a cut-off state. Although this formally means that the PMOS transistors 312, 314 are permanently off, the fact that these transistors form part of an integrated circuit manufactured at a process node below 100 nm (specifically illustrated circuit is embodied in an integrated circuit manufactured at a CMOS 20 nm process), means that a leakage current will inevitably always flow through these transistors. The self-biased current mirror 310 takes advantage of this fact, operating in this deep sub-threshold state, with the bias signal VB1 being taken from a midpoint between the first transistor 312 and the second transistor 314. VB1 provides one input to the multiplexer 350.

The second self-biased current mirror 320 generates a second bias signal VB2. This self-biased current mirror also comprises PMOS transistors, but the PMOS transistors 322, 324, 326 have their respective gates tied to their drains such that the self-biased current mirror 320 operates in a strong inversion state and the current of the bias signal VB2 is noticeably greater than that of VB1. Whilst the PMOS transistors 312, 314 in self-biased current mirror 310 are minimum sized for the process node at which this integrated circuit is manufactured, the PMOS transistors 322, 324, 326 in self-biased current mirror 320 are maximum sized for the process node. Indeed, in order to reduce manufacturing variation for the VSS side of self-biased current mirror 320, a pair of PMOS transistors 324, 326 is provided, effectively providing a double channel length transistor. The wells of PMOS transistors 322, 324, 326 are also tied to VDD to avoid latchup. The bias signal VB2 provides the other input to multiplexer 350.

Depending on the frequency regime in which the frequency generator 300 should operate, the selection signal SEL steers the multiplexer 350 to select one of the input bias signals VB1 and VB2 for controlling the operation of the current starved oscillator 340. Hence, the output of the multiplexer 350 is coupled to the current multiplier 330 in order to provide a suitable current level for the required frequency generation. Current multiplier 330 comprises a PMOS transistor 332 and a NMOS transistor 334. The gates of these transistors are coupled to the VPBIAS and the VNBIAS inputs of the current starved oscillator 340 respectively. The well of PMOS transistor 332 is tied to VDD and the well of NMOS transistor 334 is tied to VSS to avoid latchup.

This arrangement, in particular the provision of self biasing current sources which produce a constant current for the inverters in the current starved oscillator chain provide a frequency generator which can produce an output frequency signal in more than one frequency regime, but nevertheless runs very quietly (with low noise) and consumes very little power. Furthermore, this arrangement enables the oscillator to quickly switch between the frequencies very smoothly without causing undesirable "glitches" on the power supply. As both charging and discharging the output load capacitance of the oscillator is driven by a constant current, the oscillator runs particularly quietly (i.e. noiselessly) and uses very little power. This makes this kind of oscillator very suitable for mobile power management systems, charge pumps, successive approximation ADC and VI converters or temperature sensors.

Figure 5:
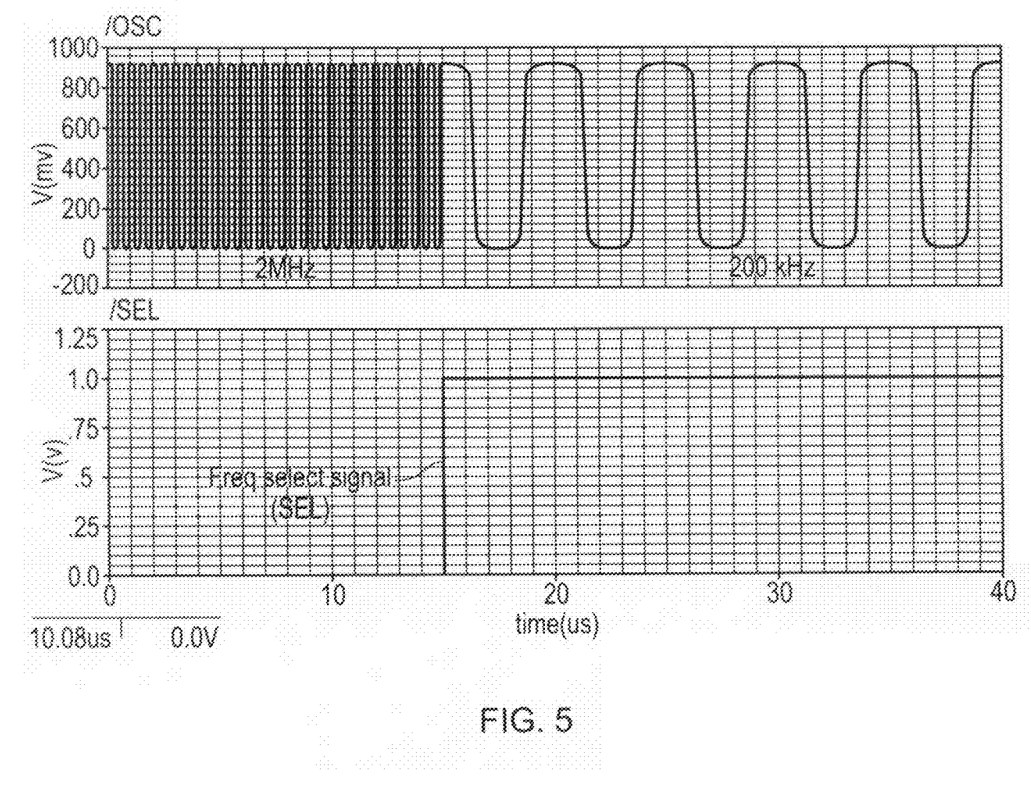
FIG. 5 illustrates the frequency switching of a frequency generator such as that schematically illustrated in FIG. 4.

FIG. 5 illustrates the switching of the frequency generator shown in FIG. 4. In this example, the oscillator is initially running at 2 MHz. After some specific time (at around 15 μs on the timescale shown) the frequency select signal is asserted, causing the oscillator to switch from ~2 MHz operation to ~200 kHz operation. In other words, the bias signal selected by multiplexer 350 changes from VB2 (low power operation) to VB1 (ultra low power operation). Notice also the very smooth changeover from 2 MHz operation to 200 kHz operation, with essentially no coupling noise. For example, the frequency selection signal may be provided by a control system or a sensor to tell the oscillator to start running slower in the ultra low power mode. This could say happen when a circuit using the output frequency signal reaches a desired operating state, or when the current activity of the system is low, so the oscillator is switched to its ultra low power mode to save power drain on a battery.

Figure 6:
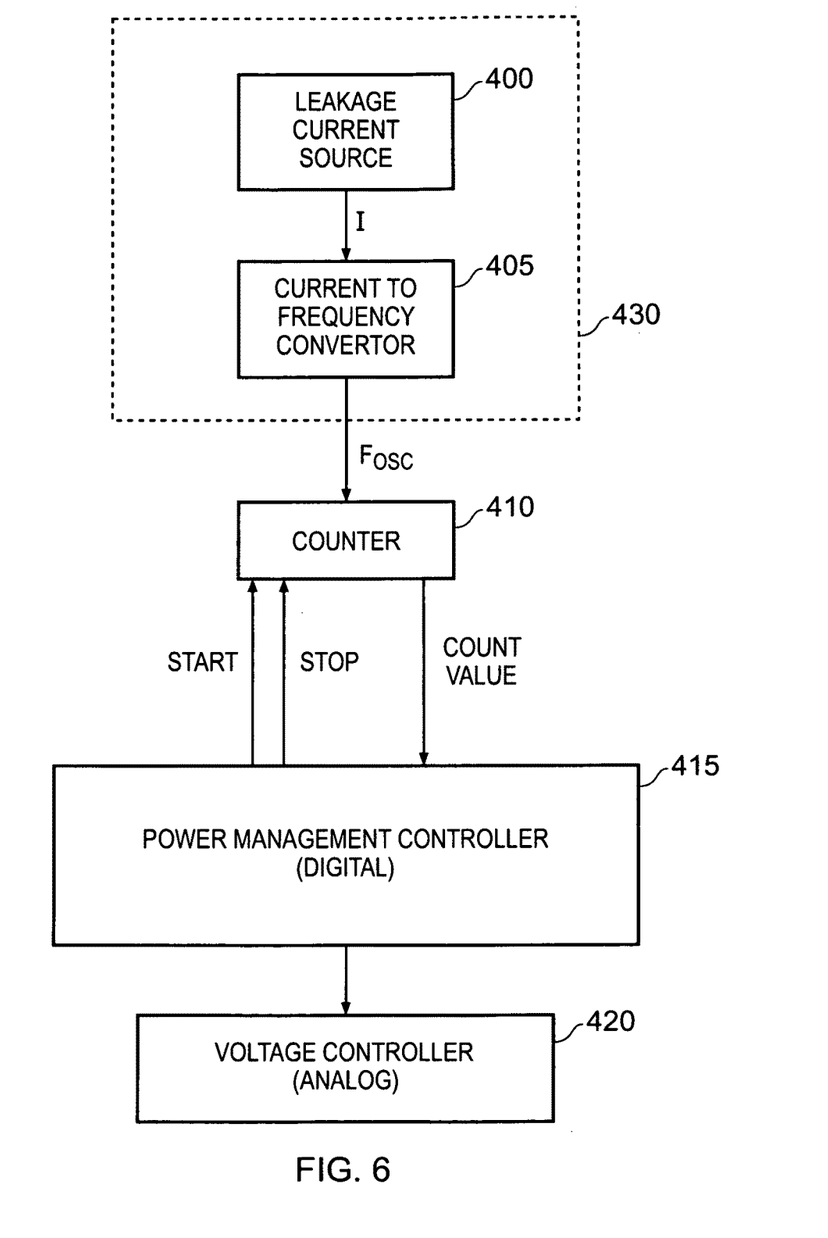
FIG. 6 schematically illustrates the use of a frequency generator in a power management context.

FIG. 6 schematically illustrates how the frequency generator may be used in a system in which a measurement of the leakage current is used to control part of the system. A leakage current source 400 provides a leakage current to a current-to-frequency generator 405, which converts the leakage current into an output frequency signal $F_{OSC}$. It will be appreciated that the leakage current source 400 and the current-to-frequency generator 405 together form a frequency generator (dashed line 430) such as is described above. The output frequency signal $F_{OSC}$ is provided to a counter 410, which is configured to increment in dependence on transitions of $F_{OSC}$. Counter 410 is configured to start counting and to stop counting under control of the power management controller 415. Accordingly, by causing the counter 410 to count for a predetermined time period, the power management controller 415 can receive a count value from counter 410 which corresponds to the frequency of the $F_{OSC}$ signal and therefore is indicative of the leakage current. Hence, in dependence on the count value provided by the counter 410, the power management controller 415 can take appropriate action, for example causing the supply voltage VDD in the system to be reduced if the leakage current rises too high. The (digital) power management controller 415 does this by signalling to the (analog) voltage controller 420. Conversely, if the leakage current is determined to have fallen below a predetermined threshold, the power management controller may allow the voltage controller to increase the supply voltage. Other power related actions are also contemplated, such as switching on/off non-essential components or changing modes of operation.

Figure 7:
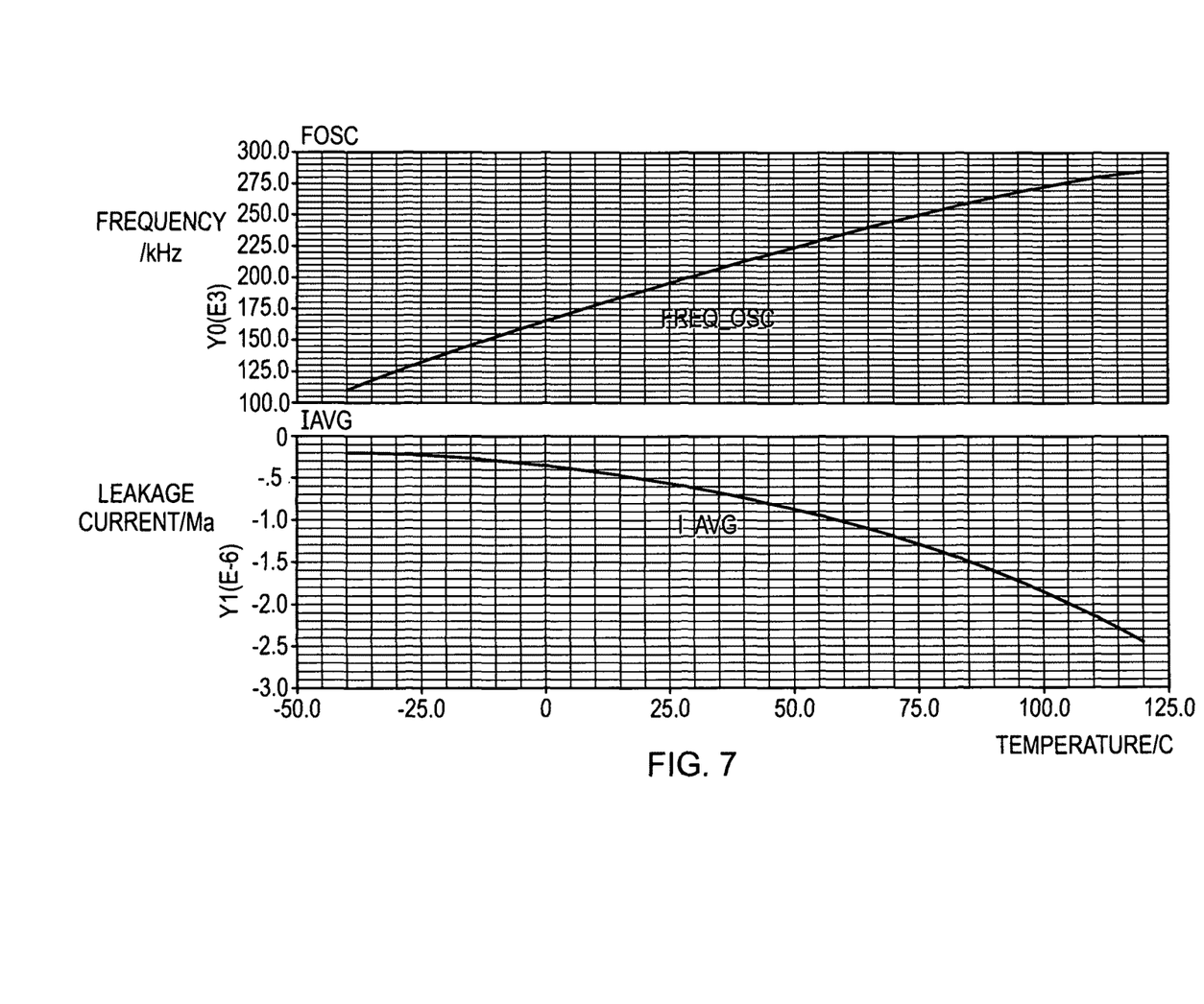
FIG. 7 illustrates the evolution with temperature of the average current drawn by the oscillator and its frequency of oscillation in one embodiment.

The leakage current may, in particular, vary with temperature. FIG. 7 shows the evolution with temperature (in a range from −40 C to +120 C) of the current drawn by the oscillator and its corresponding $F_{OSC}$ frequency, for the embodiment discussed with reference to FIG. 4, when operating in the 200 kHz regime and with VDD=0.9 V. At a working temperature of 30 C it can be seen that the frequency of oscillation is a little over 200 kHz and the average current drawn is just over 600 nA. Even when this frequency generator is switched to the 2 MHz, the typical current drawn is still in a very low power regime, being around 2.5 μA.

It should be noted that the design is not limited to these particular frequency regimes (200 kHz and 2 MHz) and can easily be scaled to other frequencies, whilst still retaining the advantageous properties of very low power and quiet operation. For example, the described embodiment could be scaled to 32 kHz with an average current drawn of 100 nA.

Figure 8:
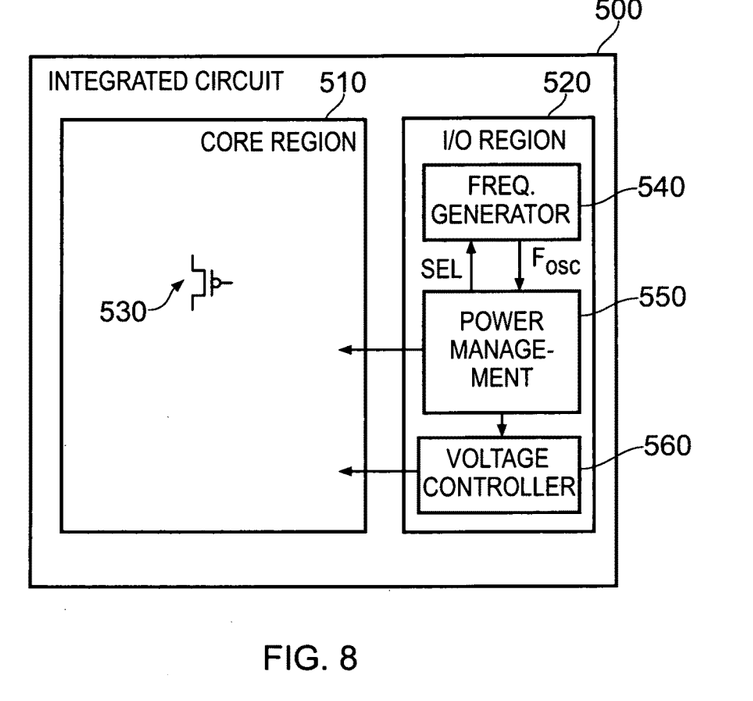
FIG. 8 schematically illustrates an integrated circuit comprising a core region and an input-output region in one embodiment.

FIG. 8 schematically illustrates an integrated circuit 500 manufactured in a CMOS 20 nm process. The integrated circuit 500 comprises a core region 510 and an input-output (I/O) region 520. Transistors within the core region 510, such as the example illustrated transistor 530, are in the great majority sized to have a minimum oxide thickness and a minimum channel length for the process node. The I/O region 520 comprises a frequency generator 540, a power management unit 550 and a voltage controller 560. The frequency generator 540, power management unit 550 and voltage controller 560 operate as described with reference to FIG. 6 (note that the counter 410 in FIG. 6 here forms part of the power management unit 550). In dependence on the output frequency signal $F_{OSC}$ provided by the frequency generator 540, the power management unit 550 can perform system control operations, such as signalling directly to components of the core region (e.g. to switch mode of operation) and signalling to the voltage controller 560 to adapt the voltage supplied to some or all of the system as required.

Although particular embodiments of the invention have been described herein, it will be apparent that the invention is not limited thereto, and that many modifications and additions may be made within the scope of the invention. For example, various combinations of the features of the following dependent could be made with the features of the independent claims without departing from the scope of the present invention.

I claim:

1. A frequency generator embodied in an integrated circuit manufactured at a process node below 100 nm, the frequency generator comprising:
   a current starved oscillator configured to generate an output frequency signal in dependence on a voltage of a bias signal; and a self-biased current generator configured to generate said bias signal, wherein said self-biased current generator comprises a first transistor and a second transistor connected in series, said bias signal being taken from a midpoint between said first transistor and said second transistor, and respective gates of said first and second transistors are connected to keep said first and second transistors in a cut-off state, such that said self-biased current generator operates in a deep sub-threshold state and a current of said bias signal is dependent on a leakage current in said first and second transistors.

2. The frequency generator as claimed in claim 1, further comprising a current multiplier, said current multiplier configured to receive said bias signal from said self-biased current generator, to multiply up said current of said bias signal to generate an enhanced current bias signal, and to provide said enhanced current bias signal to said current starved oscillator.

3. The frequency generator as claimed in claim 2, wherein said current multiplier is further configured to generate a mirrored enhanced current bias signal, and to provide said enhanced current bias signal and said mirrored enhanced current bias signal to respective positive and negative bias inputs of said current starved oscillator.

4. The frequency generator as claimed in claim 1, further comprising:
a further self-biased current generator configured to generate a further bias signal; and
a multiplexer configured to receive said bias signal from said self-biased current generator and said further bias signal from said further self-biased current generator, and said multiplexer is further configured to output a selected bias signal to said current starved oscillator in dependence on a selection signal.

5. The frequency generator as claimed in claim 4, further comprising:
at least one additional further self-biased current generator configured to generate at least one additional further bias signal.

6. The frequency generator as claimed in claim 4, wherein said further self-biased current generator comprises:
two further transistors connected in series, said further bias signal being generated at a further midpoint between said further transistors,
and respective gates of said further transistors are connected to operate said further self-biased current generator in a strong inversion state, such that a current of said further bias signal is greater than said current of said bias signal, and such that a frequency of said output frequency signal is greater in response to said further bias signal than in response to said bias signal.

7. The frequency generator as claimed in claim 1, wherein at least one of said two further transistors of said further self-biased current generator comprises a transistor pair configured to provide an longer channel length transistor.

8. The frequency generator as claimed in claim 1, wherein said current starved oscillator comprises a plurality of inverters, wherein each inverter of said plurality of inverters is connected to voltage supply rails via bias transistors controlled in dependence on said bias signal.

9. The frequency generator as claimed in claim 8, wherein said bias transistors comprise a supply-side bias transistor and a ground-side bias transistor, wherein said supply-side bias transistor is controlled in dependence on said bias signal and said ground-side bias transistor is controlled by a mirrored version of said bias signal.

10. The frequency generator as claimed in claim 1, wherein said first transistor and said second transistor have a minimum oxide thickness and a minimum channel length for the process node.

11. The frequency generator as claimed in claim 1, wherein said first transistor and said second transistor have an oxide thickness and a channel length which are sized like a majority of transistors in said integrated circuit.

12. The frequency generator as claimed in claim 1, wherein said frequency generator forms part of an input-output region of said integrated circuit and said integrated circuit further comprises a core region, wherein said first transistor and said second transistor have an oxide thickness and a channel length corresponding to core region transistors.

13. The frequency generator as claimed in claim 6, wherein said further transistors have an oxide thickness and a channel length which are maximum sized for the process node.

14. The frequency generator as claimed in claim 6, wherein said further transistors have an oxide thickness and a channel length which are sized to be larger than a majority of transistors in said integrated circuit.

15. The frequency generator as claimed in claim 6, wherein said frequency generator forms part of an input-output region of said integrated circuit and said integrated circuit further comprises a core region, wherein said further transistors have an oxide thickness and a channel length corresponding to input-output region transistors.

16. The frequency generator as claimed in claim 1, wherein said process node is below 65 nm.

17. The frequency generator as claimed in claim 1, wherein said process node is below 32 nm.

18. The frequency generator as claimed in claim 1, wherein said first transistor and said second transistor are a same type of transistor.

19. The frequency generator as claimed in claim 18, wherein said first transistor and said second transistor are PMOS transistors.

20. The frequency generator as claimed in claim 19, wherein said PMOS transistors are source-gate coupled.

21. The frequency generator as claimed in claim 1, further comprising a digital counter configured to receive said output frequency signal and to increment in dependence on transitions of said output frequency signal; and
a power management unit configured read said digital counter before and after a predetermined time period to determine a count value.

22. The frequency generator as claimed in claim 20, wherein said power management unit is configured to perform system control operations in dependence on said count value.

23. A data processing system embodied in an integrated circuit manufactured at a process node below 100 nm, the data processing system comprising the frequency generator as claimed in claim 4,
said data processing system comprises a power management unit configured to generate said selection signal in dependence on an operating state of said data processing system.

24. A frequency generator embodied in an integrated circuit manufactured at a process node below 100 nm, the frequency generator comprising:
current starved oscillator means for generating an output frequency signal in dependence on a voltage of a bias signal; and
self-biased current generator means for generating said bias signal, wherein said self-biased current generator means comprises a first transistor and a second transistor connected in series, said bias signal being taken from a midpoint between said first transistor and said second transistor, and respective gates of said first and second transistors are connected to keep said first and second transistors in a cut-off state, such that said self-biased current generator means operates in a deep sub-threshold state and a current of said bias signal is dependent on a leakage current in said first and second transistors.

25. A method of generating an output frequency signal in a frequency generator embodied in an integrated circuit manufactured at a process node below 100 nm, the method comprising the steps of:

providing a self-biased current generator arranged to generate a bias signal, wherein said self-biased current generator comprises a first transistor and a second transistor connected in series, said bias signal being taken from a midpoint between said first transistor and said second transistor, and respective gates of said first and second transistors are connected to keep said first and second transistors in a cut-off state;

operating said self-biased current generator in a deep sub-threshold state to generate said bias signal, such that a current of said bias signal is dependent on a leakage current in said first and second transistors; and generating an output frequency signal in dependence on a voltage of said bias signal in a current starved oscillator.

* * * * *